United States Patent
Imai

(10) Patent No.: US 7,649,177 B2
(45) Date of Patent: Jan. 19, 2010

(54) RADIATION IMAGE DETECTOR

(75) Inventor: Shinji Imai, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 458 days.

(21) Appl. No.: 11/590,786

(22) Filed: Nov. 1, 2006

(65) Prior Publication Data

US 2007/0108398 A1   May 17, 2007

(30) Foreign Application Priority Data

Nov. 1, 2005   (JP) ............................. 2005-318155
Aug. 22, 2006  (JP) ............................. 2006-224995

(51) Int. Cl.
   *G01T 1/24*   (2006.01)
(52) U.S. Cl. .............................. 250/370.08; 250/370.09
(58) Field of Classification Search ................. 250/580, 250/370.08, 370.09
   See application file for complete search history.

(56) References Cited

U.S. PATENT DOCUMENTS

| | | | |
|---|---|---|---|
| 3,685,989 | A | 8/1972 | Galen |
| 4,900,975 | A * | 2/1990 | Shimomoto et al. ......... 313/366 |
| 5,320,927 | A | 6/1994 | Fender et al. |
| 5,396,072 | A | 3/1995 | Schiebel et al. |
| 6,171,643 | B1 | 1/2001 | Polischuk et al. |
| 6,774,385 | B2 | 8/2004 | Imai |
| 2003/0223534 | A1 | 12/2003 | Sato et al. |
| 2004/0104362 | A1 | 6/2004 | Imai |
| 2005/0104019 | A1 * | 5/2005 | Imai ........................... 250/591 |
| 2007/0012890 | A1 * | 1/2007 | Irisawa ....................... 250/581 |

FOREIGN PATENT DOCUMENTS

| | | | |
|---|---|---|---|
| JP | 60101541 A | * | 6/1985 |
| JP | 10-104358 A | | 4/1998 |
| JP | 2002329848 A | | 11/2002 |

* cited by examiner

*Primary Examiner*—David P Porta
*Assistant Examiner*—Marcus H Taningco
(74) *Attorney, Agent, or Firm*—Sughrue Mion, PLLC

(57) ABSTRACT

A radiation image detector includes a first electrode for transmitting an electromagnetic wave for recording, the electromagnetic wave carrying a radiation image, a photoconductive layer for recording, a plurality of charge-collecting electrodes, and a substrate. The photoconductive layer for recording generates charges by irradiation with the electromagnetic wave for recording that has been transmitted through the first electrode, and has amorphous selenium as its major component and further contains alkali metal. The first electrode, the photoconductive layer for recording, the plurality of charge-collecting electrodes and the substrate are superposed one on another in this order. Further, an amorphous selenium layer is provided as an anti-crystallization layer between the first electrode and the photoconductive layer for recording. The amorphous selenium layer contains at least one element selected from the group consisting of As, Sb and Bi at 5% to 40%.

25 Claims, 4 Drawing Sheets

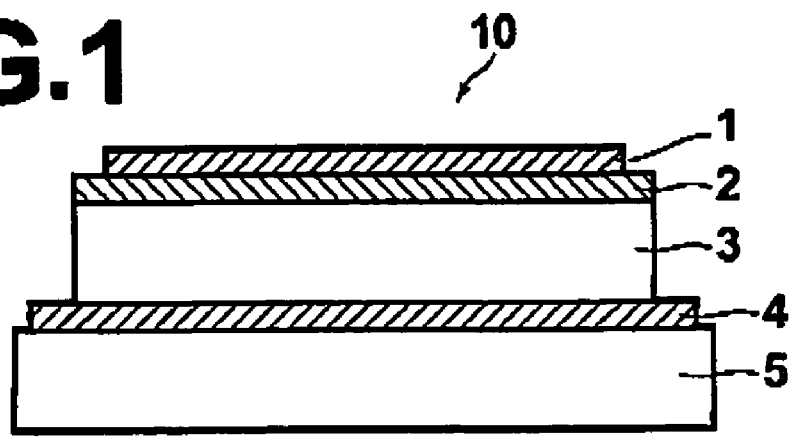
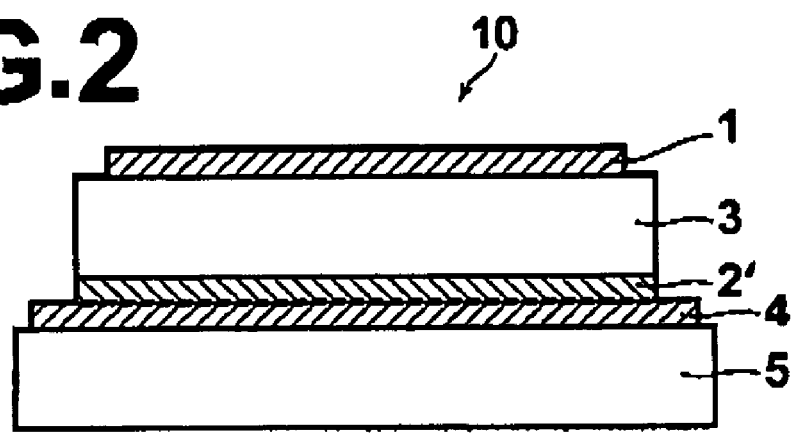
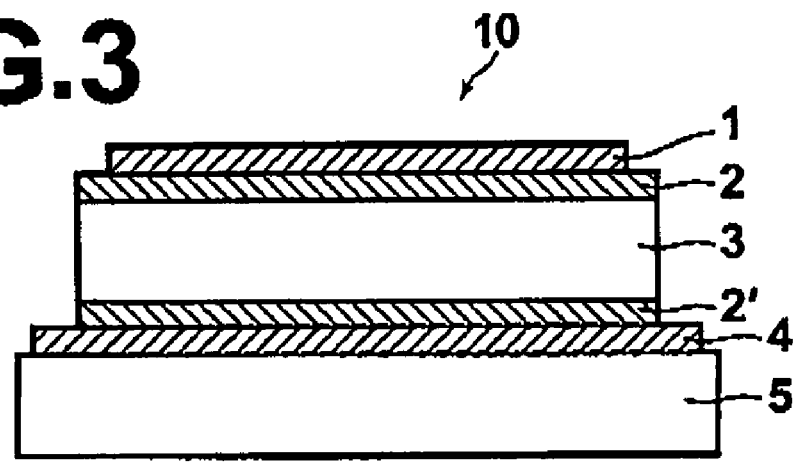

RADIATION IMAGE DETECTOR

BACKGROUND OF THE INVENTION

1. Field of the Invention

The present invention relates to a radiation image detector for recording image information as an electrostatic charge pattern (electrostatic latent image) formed by irradiation with a radiation, such as X-rays.

2. Description of the Related Art

Conventionally, a radiation image detector using an X-ray sensitive photoconductive layer as a photosensitive material is well known in medical X-ray photography. The radiation image detector is used to reduce a radiation dose received by a patient and to improve the efficiency of diagnosis. In the radiation image detector, an electrostatic image formed in the photoconductive layer by irradiation with X-rays is read out by light or by a multiplicity of electrodes and recorded. Such a radiation image detector is advantageous in that it has higher resolution than that of an indirect photography method using a TV pickup tube, which is a well-known photography method.

In the radiation image detector, charges (electric charges) corresponding to X-ray energy are generated by irradiating a charge generation layer with X-rays. The generated charges are read out as electric signals. In the radiation image detector, the photoconductive layer functions as a charge generation layer. Conventionally, amorphous selenium (a-Se) has been used as the photoconductive layer.

A large area of coating (layer) can be easily formed with the amorphous selenium by using a coating formation method (thin-film formation method), such as a vapor deposition method (evaporation method). However, since amorphous selenium tends to have many structural defects, the sensitivity of the photoconductive layer easily deteriorates. Therefore, an appropriate amount of dopant (impurity) is generally added (doping).

For example, the specification of U.S. Pat. No. 3,685,989 discloses a technique for forming an efficient photoconductive layer, in which both electrons and positive holes (holes) travel (move), by doping a-Se or an a-Se:As alloy with alkali metal at from 5 to 5000 ppm. However, if a-Se is doped with Na at 0.01 ppm or more, interface crystallization (surface crystallization) easily occurs at a surface contacting with electrodes, thereby causing image defects. Further, the properties of the photoconductive layer tend to change by humidity and it is difficult to achieve durability. Even if the doping amount of Na at the bulk of a-Se is less than 0.01 ppm, if the amount of Na at the interface is greater than or equal to 0.01 ppm, the problem that a-Se that contains alkali metal is easily crystallized at interfaces occurs. Particularly, when the electrode substrate is a substrate on which a multiplicity of switching devices (TFT: thin film transistor) and a multiplicity of pixel electrodes are two-dimensionally arranged, or when the electrode substrate is a substrate on which a multiplicity of linear electrodes for readout is arranged, the electrodes are formed by fine patterning and the surface of the substrate is uneven. Therefore, crystallization tends to occur at the uneven portions formed by the electrodes. Further, when an upper electrode for applying a bias electric field is provided on the photoconductive layer, crystallization easily occurs directly below the upper electrode by thermal radiation damage or the like during formation of the upper electrode.

U.S. Patent Application Publication No. 20030223534 discloses a technique for preventing sensitivity deterioration by doping a-Se with alkali metal at from 0.01 ppm to 10 ppm. In U.S. Patent Application Publication No. 20030223534, a lower carrier selection layer made of AsSe, $Sb_2S_3$ or the like is provided between a lower electrode (TFT) and an a-Se layer to suppress dark current (dark electric current). Further, an upper carrier selection layer made of CdS, $Sb_2S_3$ or the like is further provided between an upper electrode and the a-Se layer. In this structure, a photoconductive layer for recording that has a-Se as its major component and further contains alkali metal is provided on the lower carrier selection layer, which does not have Se as its major component, and which is made of a different kind of material. Therefore, there is a tendency that stress is applied to a contact surface therebetween by a difference in lattice constants, a difference in thermal expansion coefficients or the like. Hence, crystallization of Se at the interface easily occurs. Further, since the upper carrier selection layer that does not have Se as its major component, and that is made of a different kind of material, is provided on the photoconductive layer for recording that has a-Se as its major component and further contains alkali metal, there is a tendency that stress is applied to a contact surface therebetween by a difference in lattice constants, a difference in thermal expansion coefficients or the like. Further, crystallization at the interface tends to occur by thermal radiation damage during formation of the upper carrier selection layer.

Further, in U.S. Pat. No. 5,396,072, a technique for reducing dark current is also disclosed. In this technique, a layer of a-Se to which As (arsenic) has been added at from 0.1% to 1%, and that has a thickness of from 200 to 800 μm, and a layer of a-Se that is doped with alkali metal at 20 to 200 ppm as a carrier selection layer are superposed one on the other. Further, a photoconductive layer for recording that has a-Se as its major component and further contains alkali metal is used. In this technique, a layer of Se to which As has been added at from 0.1 to 1% is inserted at the interface between the carrier selection layer and electrodes to suppress dark current.

Further, in Japanese Unexamined Patent Publication No. 10 (1998)-104358, a technique for depositing a-Se that is doped with alkali at 1 to 1000 ppm as a monopole conductive layer is disclosed. The monopole conductive layer is a monopole conductive layer for suppressing dark current, and the monopole conductive layer is provided between a photoconductive layer and an upper electrode. The photoconductive layer is a layer made of a-Se that is doped with As and Cl, and the thickness of the photoconductive layer is in the range between 100 μm and 2 mm. The monopole conductive layer may also contain As at 0.5 to 5 wt %. However, if the monopole conductive layer contains As at greater than 5 wt %, the monopole conductive layer does not function as a monopole conductive layer. Further, it is necessary that the thickness of the monopole conductive layer is within the range of from 0.5 to 10 μm to capture injected charges.

Further, in Japanese Unexamined Patent Publication No. 10(1998)-104358, a technique for providing an $a-As_2Se_3$ layer as an interrupt buffer layer is also disclosed. The $a-As_2Se_3$ layer is provided between the photoconductive layer made of a-Se that is doped with As and Cl and a lower electrode, and the thickness of the photoconductive layer is in the range between 100 μm and 2 mm. The interrupt buffer layer is provided to improve an electron blocking characteristic and bonding with a glass substrate, and it is necessary that the thickness of the interrupt buffer is in the range of from 0.5 to 10 μm. Further, it is described that the interrupt buffer layer can prevent crystallization at the interface with a-Se that is doped with As and Cl.

However, the photoconductive layer made of Se that is doped with alkali metal, as disclosed in each of the aforementioned documents, tends to crystallize at the interface with a lower layer (hereinafter, referred to as a lower layer) and at the interface with an upper layer (hereinafter, referred to as an upper layer) The lower layer refers to a lower carrier selection layer if the lower carrier selection layer, which is made of a different kind of substance that does not contain Se as its major component, is provided. If the lower carrier selection layer is not provided, the lower layer refers to a lower electrode. Further, the upper layer refers to an upper carrier selection layer if the upper carrier selection layer, which is made of a different kind of substance that does not contain Se as its major component, is provided. If the upper carrier selection layer is not provided, the upper layer refers to an upper electrode. Since crystallization tends to occur at the interfaces, it is impossible to prevent an increase in image defects and to prevent a decrease in durability.

Further, when the layers are formed, as disclosed in U.S. Patent Application Publication No. 20030223534, the mask size of the carrier selection layer and that of the a-Se layer are different from each other. Therefore, time for changing the masks is required. Since the time for changing the masks is long, there is a problem that impurity ($H_2O$ or oxygen), which accelerates crystallization, is incorporated between the carrier selection layer and the a-Se layer. Further, it is impossible to reduce crystallization at the interface by using the technique disclosed in U.S. Pat. No. 5,396,072, namely by providing a Se layer to which As has been added at from 0.1 to 1% at the interface between the carrier selection layer and the electrode. Further, it is impossible to reduce image defects.

Further, it is impossible to reduce crystallization at the interface by using the method, as disclosed in Japanese Unexamined Patent Publication No. 10(1998)-104358. Further, it is impossible to reduce image defects. In the method disclosed in Japanese Unexamined Patent Publication No. 10(1998)-104358, As is added at 0.5 to 5 wt % to the bulk of a monopole conductive layer made of a-Se that is doped with alkali. Further, in an interrupt buffer formed by a a-$As_2Se_3$ layer as disclosed in Japanese Unexamined Patent Publication No. 10(1998)-104358, holes (electron holes) that have moved from a photoconductive layer for recording widely diffuse. Therefore, there is a problem that resolution easily deteriorates. Further, Japanese Unexamined Patent Publication No.10(1998)-104358 is silent about crystallization of the a-$As_2Se_3$ layer at the interface with a layer made of a-Se that contains alkali metal.

Further, If $Sb_2S_3$, which is disclosed in U.S. Patent Application Publication No. 20030223534, is used to form a lower carrier selection layer, it is possible to prevent diffusion of electric charges because $Sb_2S_3$ is a semi-insulator. Further, resolution does not deteriorate (please refer to Japanese Unexamined Patent Publication No. 2001-284628). However, there is a problem that crystallization easily occurs at the interface between the lower layer made of $Sb_2S_3$ and the photoconductive layer for recording that is made of a-Se that contains alkali metal. Therefore, it is impossible to prevent both deterioration in resolution and crystallization at the same time.

SUMMARY OF THE INVENTION

In view of the foregoing circumstances, it is an object of the present invention to solve the problem of crystallization at the interface between a photoconductive layer and a lower layer and at the interface between the photoconductive layer and an upper layer, thereby improving the travel characteristic (mobility) of electrons. Here, the photoconductive layer is a layer having a-Se as its major component and further containing alkali metal. Further, it is an object of the present invention to provide a radiation image detector that can prevent an increase in image defects due to time passage.

In a first embodiment of the present invention, a radiation image detector of the present invention is a radiation image detector comprising;

a first electrode for transmitting an electromagnetic wave for recording, the electromagnetic wave carrying a radiation image;

a photoconductive layer for recording;

a plurality of charge-collecting electrodes; and a substrate, wherein the photoconductive layer for recording generates charges by irradiation with the electromagnetic wave for recording that has been transmitted through the first electrode, and wherein the photoconductive layer for recording has amorphous selenium as its major component and further contains alkali metal, and wherein the first electrode, the photoconductive layer for recording, the plurality of charge-collecting electrodes and the substrate are superposed one on another in this order, and wherein an amorphous selenium layer is further provided as an anti-crystallization layer between the first electrode and the photoconductive layer for recording, and wherein the amorphous selenium layer contains at least one element selected from the group consisting of As, Sb and Bi at 5% to 40%.

The content of the aforementioned elements is represented by weight %. Further, the photoconductive layer for recording that has amorphous selenium as its major component refers to a photoconductive layer, in which the weight % of an amorphous selenium component is highest of its components (hereinafter, these phrases will also be used in similar meanings in descriptions of radiation image detectors in other embodiments of the present invention).

Optionally, the thickness of the anti-crystallization layer may be in the range of from 0.05 μm to 0.3 μm.

Further, in another embodiment of the first radiation image detector, the radiation image detector of the present invention is a radiation image detector comprising:

a first electrode for transmitting an electromagnetic wave for recording, the electromagnetic wave carrying a radiation image;

a photoconductive layer for recording;

a plurality of charge-collecting electrodes; and a substrate, wherein the photoconductive layer for recording generates charges by irradiation with the electromagnetic wave for recording that has been transmitted through the first electrode, and wherein the photoconductive layer for recording has amorphous selenium as its major component and further contains alkali metal, and wherein the first electrode, the photoconductive layer for recording, the plurality of charge-collecting electrodes and the substrate are superposed one on another in this order, and wherein an amorphous selenium layer is further provided as an anti-crystallization layer between the first electrode and the photoconductive layer for recording, and wherein the amorphous selenium layer contains at least one element selected from the group consisting of As, Sb and Bi, and wherein the anti-crystallization layer includes at least a region in which the value of the concentration of the at least one element is highest and a region in which the value of the concentration of the at least one element is less than or equal to 80% of the highest value of the concentration of the at least one element. Optionally, in the radiation image detector, the concentration of the at least one element in the region in which the value of the concentration of the at least one element is highest may be in the range of from 5% to 40%.

Optionally, the radiation image detector may be a radiation image detector, wherein the value of the concentration of the at least one element in the anti-crystallization layer is highest in a region within 50 nm from the interface with an upper layer positioned on a side of the anti-crystallization layer, the side being opposite to the photoconductive layer for recording, wherein the upper layer does not contain amorphous selenium as its major component.

Alternatively, the value of the concentration of the at least one element in the anti-crystallization layer may be highest in a region within 50 nm from the interface with the photoconductive layer for recording.

Further optionally, the radiation image detector may be a radiation image detector, wherein an average concentration of the at least one element in the anti-crystallization layer excluding an upper-layer-side region and a photoconductive-layer-for-recording-side region is less than or equal to 80% of the smaller of the highest value of the concentration of the at least one element in the upper-layer-side region and that of the concentration of the at least one element in the photoconductive-layer-for-recording-side region, and wherein the upper-layer-side region is a region of the anti-crystallization layer within 50 nm from the interface with an upper layer positioned on a side of the anti-crystallization layer, the side being opposite to the photoconductive layer for recording, and wherein the upper layer does not contain amorphous selenium as its major component, and wherein the photoconductive-layer-for-recording-side region is a region of the anti-crystallization layer within 50 nm from the interface with the photoconductive layer for recording.

The upper layer that does not contain amorphous selenium as its major component refers to an upper layer, in which the weight % of an amorphous selenium component is not highest of its components. Further, the upper layer refers to an upper carrier selection layer if the radiation image detector includes the upper carrier selection layer, which is made of a different kind of substance that does not contain amorphous selenium as its major component. If the upper carrier selection layer is not provided in the radiation image detector, the upper layer refers to a first electrode.

If the at least one element selected from the group consisting of As, Sb and Bi is at least two kinds of elements, the average concentration of the at least one element refers to an average concentration obtained by adding the weight % of each of the elements (hereinafter, the term "average concentration" is used in this meaning).

Further, in a second embodiment of the present invention, a radiation image detector of the present invention is a radiation image detector comprising:

a first electrode for transmitting an electromagnetic wave for recording, the electromagnetic wave carrying a radiation image;

a photoconductive layer for recording;

a plurality of charge-collecting electrodes; and a substrate, wherein the photoconductive layer for recording generates charges by irradiation with the electromagnetic wave for recording that has been transmitted through the first electrode, and wherein the photoconductive layer for recording has amorphous selenium as its major component and further contains alkali metal, and wherein the first electrode, the photoconductive layer for recording, the plurality of charge-collecting electrodes and the substrate are superposed one on another in this order, and wherein an amorphous selenium layer is further provided as an anti-crystallization layer between the charge-collecting electrodes and the photoconductive layer for recording, and wherein the amorphous selenium layer contains at least one element selected from the group consisting of As, Sb and Bi at 5% to 40%.

Optionally, the thickness of the anti-crystallization layer may be in the range of from 0.05 μm to 0.3 μm.

Further, in another embodiment of the second radiation image detector, the radiation image detector of the present invention is a radiation image detector comprising:

a first electrode for transmitting an electromagnetic wave for recording, the electromagnetic wave carrying a radiation image;

a photoconductive layer for recording;

a plurality of charge-collecting electrodes; and a substrate, wherein the photoconductive layer for recording generates charges by irradiation with the electromagnetic wave for recording that has been transmitted through the first electrode, and wherein the photoconductive layer for recording has amorphous selenium as its major component and further contains alkali metal, and wherein the first electrode, the photoconductive layer for recording, the plurality of charge-collecting electrodes and the substrate are superposed one on another in this order, and wherein an amorphous selenium layer is further provided as an anti-crystallization layer between the charge-collecting electrodes and the photoconductive layer for recording, and wherein the amorphous selenium layer contains at least one element selected from the group consisting of As, Sb and Bi, and wherein the anti-crystallization layer includes at least a region in which the value of the concentration of the at least one element is highest and a region in which the value of the concentration of the at least one element is less than or equal to 80% of the highest value of the concentration of the at least one element.

Optionally, in the radiation image detector, the concentration of the at least one element in the region in which the value of the concentration of the at least one element is highest may be in the range of from 5% to 40%.

Optionally, the radiation image detector may be a radiation image detector, wherein the value of the concentration of the at least one element in the anti-crystallization layer may be highest in a region within 50 nm from the interface with a lower layer positioned on a side of the anti-crystallization layer, the side being opposite to the photoconductive layer for recording, wherein the lower layer does not contain amorphous selenium as its major component.

Alternatively, the value of the concentration of the at least one element in the anti-crystallization layer may be highest in a region within 50 nm from the interface with the photoconductive layer for recording.

Further optionally, the radiation image detector may be a radiation image detector, wherein an average concentration of the at least one element in the anti-crystallization layer excluding a lower-layer-side region and a photoconductive-layer-for-recording-side region is less than or equal to 80% of the smaller of the highest value of the concentration of the at least one element in the lower-layer-side region and that of the concentration of the at least one element in the photoconductive-layer-for-recording-side region, and wherein the lower-layer-side region is a region of the anti-crystallization layer within 50 nm from the interface with a lower layer positioned on a side of the anti-crystallization layer, the side being opposite to the photoconductive layer for recording, and wherein the lower layer does not contain amorphous selenium as its major component, and wherein the photoconductive-layer-for-recording-side region is a region of the anti-crystallization layer within 50 nm from the interface with the photoconductive layer for recording.

The lower layer that does not contain amorphous selenium as its major component refers to a lower layer, in which the weight % of an amorphous selenium component is not highest of its components. Further, the lower layer refers to a lower carrier selection layer if the radiation image detector includes the lower carrier selection layer, which is made of a different kind of substance that does not contain amorphous selenium as its major component. If the lower carrier selection layer is not provided in the radiation image detector, the lower layer refers to a first electrode.

Optionally, the lower layer may be a semi-insulator layer. The semi-insulator layer is a charge transfer layer made of a semi-insulating resistance material, and the value of the specific resistance of the resistance material is greater than or equal to $10^6 \Omega \cdot cm$ and less than or equal to $10^{12} \Omega \cdot cm$. Further, connection between the charge transfer layer and the photoconductive layer (a-Se) for recording has a diode characteristic, in which the charge transfer layer functions as a cathode and a photoconductive layer (a-Se) for recording functions as an anode. Examples of the semi-insulator layer are a layer made of antimony sulfide ($Sb_2S_3$) sulfide ($As_2S_3$). Hereinafter, the semi-insulator layer is used in this meaning.

In a third embodiment of the present invention, a radiation image detector of the present invention is a radiation image detector comprising:

a first electrode for transmitting an electromagnetic wave for recording, the electromagnetic wave carrying a radiation image;

a photoconductive layer for recording;

a charge storage portion for storing charges generated in the photoconductive layer for recording;

a photoconductive layer for readout;

a multiplicity of linear electrodes for readout; and a substrate, wherein the photoconductive layer for recording generates charges by irradiation with the electromagnetic wave for recording that has been transmitted through the first electrode, and wherein the photoconductive layer for recording has amorphous selenium as its major component and further contains alkali metal, and wherein the photoconductive layer for readout generates charges by irradiation with readout light, and wherein the first electrode, the photoconductive layer for recording, the charge storage portion, the photoconductive layer for readout, the multiplicity of linear electrodes for readout and the substrate are superposed one on another in this order, and wherein an amorphous selenium layer is further provided as an anti-crystallization layer between the first electrode and the photoconductive layer for recording, and wherein the amorphous selenium layer contains at least one element selected from the group consisting of As, Sb and Bi at 5% to 40%.

Optionally, the thickness of the anti-crystallization layer may be in the range of from 0.05 μm to 0.3 μm.

Further, in another embodiment of the third radiation image detector, the radiation image detector of the present invention is a radiation image detector comprising:

a first electrode for transmitting an electromagnetic wave for recording, the electromagnetic wave carrying a radiation image;

a photoconductive layer for recording;

a charge storage portion for storing charges generated in the photoconductive layer for recording;

a photoconductive layer for readout;

a multiplicity of linear electrodes for readout; and a substrate, wherein the photoconductive layer for recording generates charges by irradiation with the electromagnetic wave for recording that has been transmitted through the first electrode, and wherein the photoconductive layer for recording has amorphous selenium as its major component and further contains alkali metal, and wherein the photoconductive layer for readout generates charges by irradiation with readout light, and wherein the first electrode, the photoconductive layer for recording, the charge storage portion, the photoconductive layer for readout, the multiplicity of linear electrodes for readout and the substrate are superposed one on another in this order, and wherein an amorphous selenium layer is further provided as an anti-crystallization layer between the first electrode and the photoconductive layer for recording, and wherein the amorphous selenium layer contains at least one element selected from the group consisting of As, Sb and Bi, and wherein the anti-crystallization layer includes at least a region in which the value of the concentration of the at least one element is highest and a region in which the value of the concentration of the at least one element is less than or equal to 80% of the highest value of the concentration of the at least one element. Optionally, in the radiation image detector, the concentration of the at least one element in the region in which the value of the concentration of the at least one element is highest may be in the range of from 5% to 40%.

Optionally, the radiation image detector may be a radiation image detector, wherein the value of the concentration of the at least one element in the anti-crystallization layer is highest in a region within 50 nm from the interface with an upper layer positioned on a side of the anti-crystallization layer, the side being opposite to the photoconductive layer for recording, wherein the upper layer does not contain amorphous selenium as its major component.

Alternatively, the value of the concentration of the at least one element in the anti-crystallization layer may be highest in a region within 50 nm from the interface with the photoconductive layer for recording.

Further optionally, the radiation image detector may be a radiation image detector, wherein an average concentration of the at least one element in the anti-crystallization layer excluding an upper-layer-side region and a photoconductive-layer-for-recording-side region is less than or equal to 80% of the smaller of the highest value of the concentration of the at least one element in the upper-layer-side region and that of the concentration of the at least one element in the photoconductive-layer-for-recording-side region, wherein the upper-layer-side region is a region of the anti-crystallization layer within 50 nm from the interface with an upper layer positioned on a side of the anti-crystallization layer, the side being opposite to the photoconductive layer for recording, and wherein the upper layer does not contain amorphous selenium as its major component, and wherein the photoconductive-layer-for-recording-side region is a region of the anti-crystallization layer within 50 nm from the interface with the photoconductive layer for recording.

The upper layer that does not contain amorphous selenium as its major component refers to an upper layer, in which the weight % of an amorphous selenium component is not highest of its components. Further, the upper layer refers to an upper carrier selection layer if the radiation image detector includes the upper carrier selection layer, which is made of a different kind of substance that does not contain amorphous selenium as its major component. If the upper carrier selection layer is not provided in the radiation image detector, the upper layer refers to a first electrode.

In a fourth embodiment of the present invention, a radiation image detector of the present invention is a radiation image detector comprising:

a first electrode for transmitting an electromagnetic wave for recording, the electromagnetic wave carrying a radiation image;

a photoconductive layer for recording;

a charge storage portion for storing charges generated in the photoconductive layer for recording;

a photoconductive layer for readout:

a multiplicity of linear electrodes for readout; and a substrate, wherein the photoconductive layer for recording generates charges by irradiation with the electromagnetic wave for recording that has been transmitted through the first electrode, and wherein the photoconductive layer for readout generates charges by irradiation with readout light, and wherein the photoconductive layer for readout has amorphous selenium as its major component and further contains alkali metal, and wherein the first electrode, the photoconductive layer for recording, the charge storage portion, the photoconductive layer for readout, the multiplicity of linear electrodes for readout and the substrate are superposed one on another in this order, and wherein an amorphous selenium layer is further provided as an anti-crystallization layer between the linear electrodes and the photoconductive layer for readout, and wherein the amorphous selenium layer contains at least one element selected from the group consisting of As, Sb and Bi at 5% to 40%.

Optionally, the thickness of the anti-crystallization layer may be in the range of from 0.05 μm to 0.3 μm.

Further, in another embodiment of the fourth radiation image detector, the radiation image detector of the present invention is a radiation image detector comprising:

a first electrode for transmitting an electromagnetic wave for recording, the electromagnetic wave carrying a radiation image;

a photoconductive layer for recording;

a charge storage portion for storing charges generated in the photoconductive layer for recording;

a photoconductive layer for readout;

a multiplicity of linear electrodes for readout; and a substrate, wherein the photoconductive layer for recording generates charges by irradiation with the electromagnetic wave for recording that has been transmitted through the first electrode, and wherein the photoconductive layer for readout generates charges by irradiation with readout light, and wherein the photoconductive layer for readout has amorphous selenium as its major component and further contains alkali metal, and wherein the first electrode, the photoconductive layer for recording, the charge storage portion, the photoconductive layer for readout, the multiplicity of linear electrodes for readout and the substrate are superposed one on another in this order, and wherein an amorphous selenium layer is further provided as an anti-crystallization layer between the linear electrodes and the photoconductive layer for readout, and wherein the amorphous selenium layer contains at least one element selected from the group consisting of As, Sb and Bi, and wherein the anti-crystallization layer includes at least a region in which the value of the concentration of the at least one element is highest and a region in which the value of the concentration of the at least one element is less than or equal to 80% of the highest value of the concentration of the at least one element. Optionally, in the radiation image detector, the concentration of the at least one element in the region in which the value of the concentration of the at least one element is highest may be in the range of from 5% to 40%.

Optionally, the radiation image detector may be a radiation image detector, wherein the value of the concentration of the at least one element in the anti-crystallization layer is highest in a region within 50 nm from the interface with a lower layer positioned on a side of the anti-crystallization layer, the side being opposite to the photoconductive layer for readout, wherein the lower layer does not contain amorphous selenium as its major component.

Alternatively, the value of the concentration of the at least one element in the anti-crystallization layer may be highest in a region within 50 nm from the interface with the photoconductive layer for readout.

Further optionally, the radiation image detector may be a radiation image detector, wherein an average concentration of the at least one element in the anti-crystallization layer excluding a lower-layer-side region and a photoconductive-layer-for-readout-side region is less than or equal to 80% of the smaller of the highest value of the concentration of the at least one element in the lower-layer-side region and that of the concentration of the at least one element in the photoconductive-layer-for-readout-side region, and wherein the lower-layer-side region is a region of the anti-crystallization layer within 50 nm from the interface with a lower layer positioned on a side of the anti-crystallization layer, the side being opposite to the photoconductive layer for readout, and wherein the lower layer does not contain amorphous selenium as its major component, and wherein the photoconductive-layer-for-readout-side region is a region of the anti-crystallization layer within 50 nm from the interface with the photoconductive layer for readout.

The lower layer that does not contain amorphous selenium as its major component refers to a lower layer, in which the weight % of an amorphous selenium component is not highest of its components. Further, the lower layer refers to a lower carrier selection layer if the radiation image detector includes the lower carrier selection layer, which is made of a different kind of substance that does not contain amorphous selenium as its major component. If the lower carrier selection layer is not provided in the radiation image detector, the lower layer refers to linear electrodes.

Optionally, the lower layer may be a semi-insulator layer.

Further, in the radiation image detector of the present invention, it is not always necessary that the photoconductive layer that has amorphous selenium as its major component and further contains alkali metal is a photoconductive layer in which the concentration of the alkali metal is evenly distributed. The photoconductive layer may be a photoconductive layer that does not contain alkali metal at the bulk thereof. The photoconductive layer may be a photoconductive layer including a region formed by amorphous selenium that contains alkali metal at least at one of the interfaces of the photoconductive layer, as disclosed in U.S. Pat. No. 5,396,072. In other words, the photoconductive layer as a whole may be a photoconductive layer formed by amorphous selenium that contains alkali metal.

Optionally, in a radiation image detector of the present invention, the content of the alkali metal may be in the range of from 0.01 to 5000 ppm.

A radiation image detector in the first embodiment of the present invention is a radiation image detector comprising:

a first electrode for transmitting an electromagnetic wave for recording, the electromagnetic wave carrying a radiation image;

a photoconductive layer for recording;

a plurality of charge-collecting electrodes; and a substrate, wherein the photoconductive layer for recording generates charges by irradiation with the electromagnetic wave for recording that has been transmitted through the first electrode, and wherein the photoconductive layer for recording has amorphous selenium as its major component and further contains alkali metal, and wherein the first electrode, the photoconductive layer for recording, the plurality of charge-collecting electrodes and the substrate are superposed one on another in this order, and wherein an amorphous selenium layer is further provided as an anti-crystallization layer between the first electrode and the photoconductive layer for recording, and wherein the amorphous selenium layer contains at least one element selected from the group consisting of As, Sb and Bi at 5% to 40%. Therefore, it is possible to prevent interface crystallization during formation of an upper layer on the photoconductive layer for recording. Hence, it is possible to improve an image quality. Further, it is possible to prevent deterioration in the performance of the radiation image detector, such as crystallization due to humidity. Further, if the thickness of the anti-crystallization layer is in the range of from 0.05 to 0.3 µm, it is possible to prevent both crystallization at the interface and increase in dark current at the same time.

Further, a radiation image detector in the second embodiment of the present invention is a radiation image detector comprising:

a first electrode for transmitting an electromagnetic wave for recording, the electromagnetic wave carrying a radiation image;

a photoconductive layer for recording;

a plurality of charge-collecting electrodes; and a substrate, wherein the photoconductive layer for recording generates charges by irradiation with the electromagnetic wave for recording that has been transmitted through the first electrode, and wherein the photoconductive layer for recording has amorphous selenium as its major component and further contains alkali metal, and wherein the first electrode, the photoconductive layer for recording, the plurality of charge-collecting electrodes and the substrate are superposed one on another in this order, and wherein an amorphous selenium layer is further provided as an anti-crystallization layer between the charge-collecting electrodes and the photoconductive layer for recording, and wherein the amorphous selenium layer contains at least one element selected from the group consisting of As, Sb and Bi at 5% to 40%. Therefore, it is possible to prevent interface crystallization during formation of the photoconductive layer for recording on a lower layer. Hence, it is possible to improve an image quality. Further, it is possible to prevent deterioration in the performance of the radiation image detector, such as crystallization due to humidity. Further, if the thickness of the anti-crystallization layer is in the range of from 0.05 to 0.3 µm, it is possible to prevent both crystallization at the interface and increase in dark current at the same time. Further, if the lower layer is a semi-insulator layer, it is possible to prevent both crystallization at the interface and diffusion of carriers that have moved to the lower layer, which is the semi-insulator layer, at the same time. Hence, it is possible to suppress deterioration in resolution.

Further, a radiation image detector in the third embodiment of the present invention is a radiation image detector comprising:

a first electrode for transmitting an electromagnetic wave for recording, the electromagnetic wave carrying a radiation image;

a photoconductive layer for recording;

a charge storage portion for storing charges generated in the photoconductive layer for recording;

a photoconductive layer for readout;

a multiplicity of linear electrodes for readout; and a substrate, wherein the photoconductive layer for recording generates charges by irradiation with the electromagnetic wave for recording that has been transmitted through the first electrode, and wherein the photoconductive layer for recording has amorphous selenium as its major component and further contains alkali metal, and wherein the photoconductive layer for readout generates charges by irradiation with readout light, and wherein the first electrode, the photoconductive layer for recording, the charge storage portion, the photoconductive layer for readout, the multiplicity of linear electrodes for readout and the substrate are superposed one on another in this order, and wherein an amorphous selenium layer is further provided as an anti-crystallization layer between the first electrode and the photoconductive layer for recording, and wherein the amorphous selenium layer contains at least one element selected from the group consisting of As, Sb and Bi at 5% to 40%. Therefore, it is possible toprevent interface crystallization during formation of an upper layer on the photoconductive layer for recording. Hence, it is possible to improve an image quality. Further, it is possible to prevent deterioration in the performance of the radiation image detector, such as crystallization due to humidity. Further, if the thickness of the anti-crystallization layer is in the range of from 0.05 to 0.3 µm, it is possible to prevent both crystallization at the interface and increase in dark current at the same time.

Further, a radiation image detector in the fourth embodiment of the present invention is a radiation image detector comprising:

a first electrode for transmitting an electromagnetic wave for recording, the electromagnetic wave carrying a radiation image;

a photoconductive layer for recording;

a charge storage portion for storing charges generated in the photoconductive layer for recording;

a photoconductive layer for readout;

a multiplicity of linear electrodes for readout; and a substrate, wherein the photoconductive layer for recording generates charges by irradiation with the electromagnetic wave for recording that has been transmitted through the first electrode, and wherein the photoconductive layer for readout generates charges by irradiation with readout light, and wherein the photoconductive layer for readout has amorphous selenium as its major component and further contains alkali metal, and wherein the first electrode, the photoconductive layer for recording, the charge storage portion, the photoconductive layer for readout, the multiplicity of linear electrodes for readout and the substrate are superposed one on another in this order, and wherein an amorphous selenium layer is further provided as an anti-crystallization layer between the linear electrodes and the photoconductive layer for readout, and wherein the amorphous selenium layer contains at least one element selected from the group consisting of As, Sb and Bi at 5% to 40%. Therefore, it is possible to prevent interface crystallization during formation of the photoconductive layer for readout on a lower layer. Hence, it is possible to improve an image quality. Further, it is possible to prevent deterioration in the performance of the radiation image detector, such as crystallization due to humidity. Further, if the thickness of the anti-crystallization layer is in the range of from 0.05 to 0.3 µm, it is possible to prevent both crystallization at the interface and increase in dark current at the same time.

Further, in another embodiment of each of the first through fourth radiation image detectors of the present invention, if the anti-crystallization layer includes at least a region in which the value of the concentration of the at least one element is highest and a region in which the value of the concentration of the at least one element is less than or equal to 80% of the highest value of the concentration of the at least one element, it is possible to reduce an average concentration of the at least one element in the whole anti-crystallization layer.

BRIEF DESCRIPTION OF THE DRAWINGS

FIG. 1 is a schematic diagram illustrating a cross-sectional view of a first embodiment of a radiation image detector (TFT method) of the present invention;

FIG. 2 is a schematic diagram illustrating a cross-sectional view of a second embodiment of a radiation image detector (TFT method) of the present invention;

FIG. 3 is a schematic diagram illustrating a cross-sectional view of a third embodiment of a radiation image detector (TFT method) of the present invention;

DESCRIPTION OF THE PREFERRED EMBODIMENTS

Figure 4:
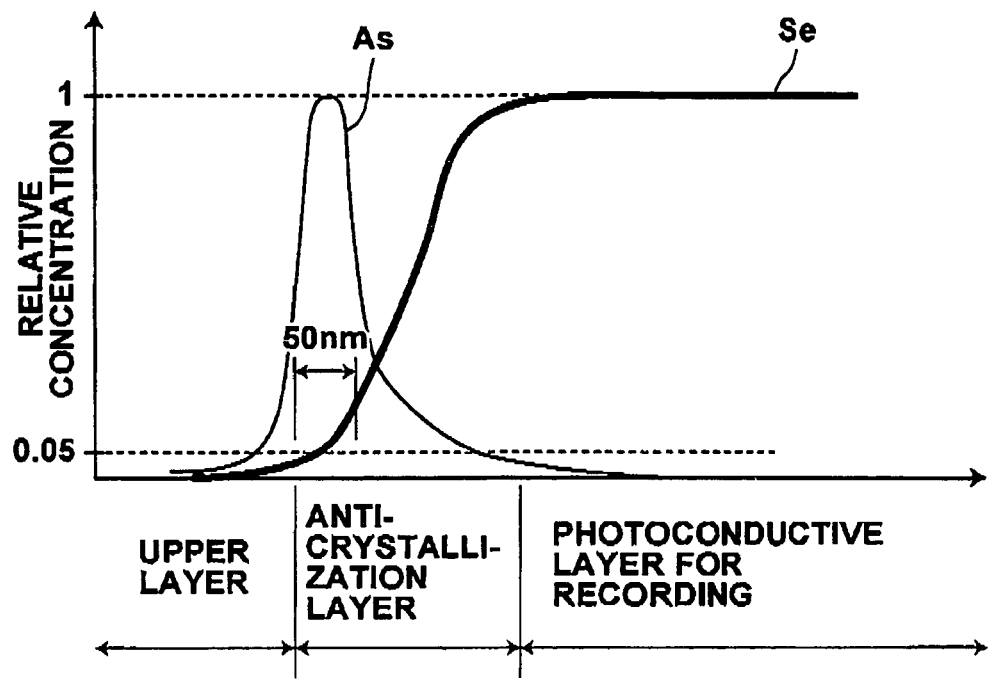
FIG. 4 is a schematic diagram illustrating a first example of the distribution of the concentration of each of As and Se in an anti-crystallization layer.

A radiation image detector of the present invention may be a radiation image detector using a so-called optical readout method. The optical readout method is a method in which readout is carried out by a radiation image detector utilizing a semiconductor-material, which generates charges by irradiation with light. Alternatively, the radiation image detector of the present invention may be a radiation image detector using a method (hereinafter, referred to as a TFT method) for reading out charges by storing charges generated by irradiation with a radiation and by turning ON/OFF electrical switches, such as thin film transistors (TFTs), pixel by pixel. A radiation image detector of the present invention will be described with reference to the attached drawings.

FIG. 1 is a schematic diagram illustrating a cross-sectional view of a first embodiment of a radiation image detector (TFT method) of the present invention. As illustrated in FIG. 1, a radiation image detector 10 in the first embodiment of the present invention includes a first electrode 1, an anti-crystallization layer 2, a photoconductive layer 3 for recording, a plurality of charge-collecting electrodes (TFT electrodes) 4 and a substrate 5, which are superposed one on another in this order. The first electrode 1 transmits an electromagnetic wave for recording that carries a radiation image. The photoconductive layer 3 for recording generates charges by irradiation with the electromagnetic wave for recording that has been transmitted through the first electrode 1. Further, the photoconductive layer 3 for recording has amorphous selenium as its major component and further contains alkali metal.

FIG. 2 is a schematic diagram illustrating a cross-sectional view of a second embodiment of a radiation image detector (TFT method) of the present invention. As illustrated in FIG. 2, a radiation image detector 10 in the second embodiment of the present invention includes a first electrode 1, a photoconductive layer 3 for recording, an anti-crystallization layer 2', a plurality of charge-collecting electrodes (TFT electrodes) 4 and a substrate 5, which are superposed one on another in this order. The first electrode 1 transmits an electromagnetic wave for recording that carries a radiation image. The photoconductive layer 3 for recording generates charges by irradiation with the electromagnetic wave for recording that has been transmitted through the first electrode 1. Further, the photoconductive layer 3 for recording has amorphous selenium as its major component and further contains alkali metal.

The anti-crystallization layer 2 illustrated in FIG. 1 and the anti-crystallization layer 2' illustrated in FIG. 2 are a-Se layers, each containing at least one element selected from the group consisting of As, Sb and Bi. The at least one element contained in each of the a-Se layers may be 5% to 40%. Optionally, the at least one element contained in each of the a-Se layers may be in the range of from 7% to 40%, and further optionally, in the range of from 10% to 40%. An appropriate range is selected from these ranges based on the level of a required anti-crystallization effect. The concentrations of these specific elements may be measured by XPS (X-ray photoelectron spectroscopy). If the ratio of the content of the at least one element selected from the group consisting of As, Sb and Bi is less than 5%, an anti-crystallization effect is not sufficient. When the ratio of the contained specific elements is greater than or equal to 5%, if the upper layer or the lower layer is made of chemically stable metal, such as Au and Pt, it is possible to sufficiently suppress crystallization. When the ratio of the contained specific elements is greater than or equal to 7%, even if alkali metal is concentrated at high concentration (1 to 1000 ppm) at the interface on the photoconductive-layer-for-recording-side of the anti-crystallization layer, it is possible to suppress crystallization at the interface. When the ratio of the contained specific elements is greater than or equal to 10%, even if alkali metal is concentrated at high concentration (1 to 1000 ppm) at the interface on the photoconductive-layer-for-recording-side of the anti-crystallization layer and an upper layer made of $Sb_2S_3$, Al or the like is provided on the anti-crystallization layer, it is possible to suppress crystallization at the interface. The upper layer made of $Sb_2S_3$, Al or the like is a layer that substantially influences the amorphous condition.

If the contained specific elements are greater than 40%, metal elements precipitate and resistance locally drops, thereby causing image defects. Therefore, it is not appropriate that the ratio of the content is greater than 40%.

Optionally, the thickness of the anti-crystallization layer may be in the range of from 0.05 to 0.5 μm. Further optionally, the thickness of the anti-crystallization layer may be in the range of from 0.05 to 0.3 μm. If the thickness is less than 0.05 μm, there is a tendency that crystallization is not prevented in some region. If the thickness is greater than 0.5 μm, the amount of trapped electric charges increases. Hence, an electric characteristic tends to deteriorate, and for example, dark current increases. If the thickness of the anti-crystallization layer is less than or equal to 0.3 μm, it is possible to prevent both increase in dark current and diffusion of electric charges at the same time. Hence, it is possible to prevent deterioration in resolution.

Figure 5:
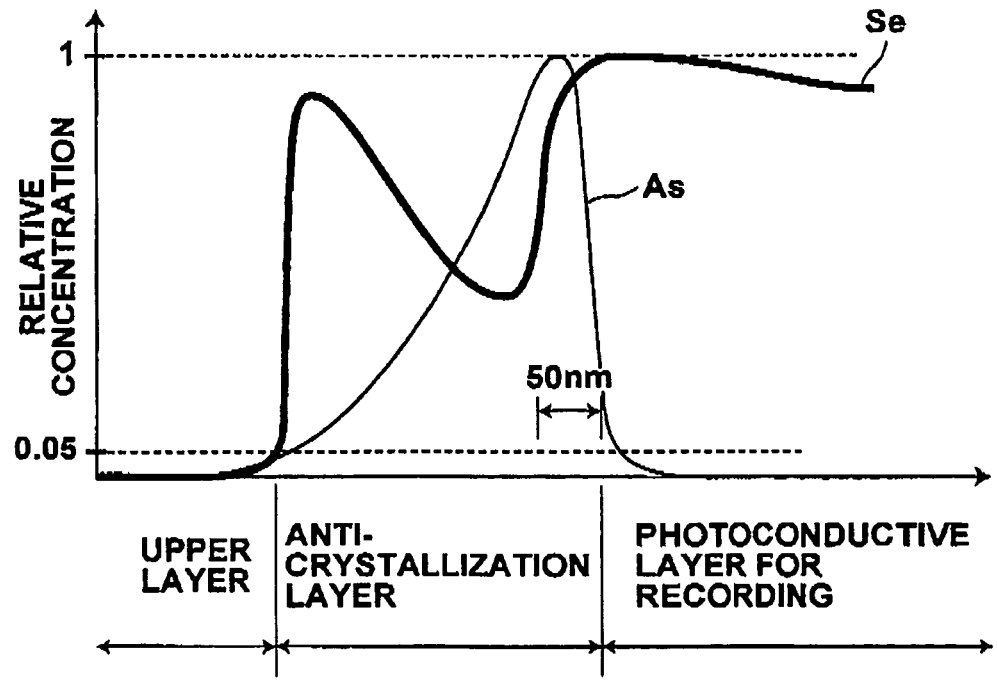
FIG. 5 is a schematic diagram illustrating a second example of the distribution of the concentration of each of As and Se in an anti-crystallization layer.

It is not necessary that the concentration of a specific element is evenly distributed in the anti-crystallization layer. It is sufficient if the anti-crystallization layer contains the specific element such that the concentration of the specific element is 5% to 40% in a region at which the concentration of the specific element is the highest in the layer. with reference to FIGS. 4 and 5, the distribution of the concentration of the specific element in the anti-crystallization will be described in detail. Here, a case in which the specific element is As will be used as an example. FIGS. 4 and 5 are schematic diagrams. In each of FIGS. 4 and 5, the horizontal axis represents the thickness of each of an upper layer, an anti-crystallization layer and a photoconductive layer for recording, and the vertical axis represents the relative concentration of As and Se (since the distribution of the specific element in a radiation image detector in other embodiments of the present invention, which will be described later, is similar to this distribution of the specific element, descriptions will be omitted in the other embodiments).

As illustrated in FIG. 4, if the concentration of As is highest in a region of the anti-crystallization layer within 50 nm from the interface with the upper layer, it is possible to effectively suppress crystallization at the contact interface with the upper layer. If the concentration of As (specific element) in the anti-crystallization is higher, the crystallization-suppression effect of the anti-crystallization layer is higher. However, the upper layer is made of a different kind of substance that does not contain selenium as its major component. Therefore, there is a tendency that stress is applied to the contact interface with the anti-crystallization layer by a difference in lattice constants, a difference in thermal expansion coefficients or the like, and crystallization especially easily occurs at the interface. Hence, if the concentration of As is highest in a region of the anti-crystallization layer within 50 nm from the interface with the upper layer, it is possible to achieve the maximum anti-crystallization-suppression effect even if the amount of doped As is small. In this case, the average concentration of As element in the region of the anti-crystallization layer within 50 nm from the interface with the photoconductive layer for recording may be less than or equal to 1%.

Here, the interface between the upper layer and the anti-crystallization layer may be defined by a position at which the concentration of Se in the anti-crystallization layer, obtained by performing XPS measurement through the anti-crystallization toward the upper layer, decreases to 5% of the concentration (highest value) of Se in the photoconductive layer for recording. Further, the interface between the anti-crystallization layer and the photoconductive layer for recording may be defined by a position at which the concentration of As in the anti-crystallization layer decreases to 5% of the highest concentration when the concentration of As is measured through the anti-crystallization layer toward the photoconductive layer for recording (the term "interface" is used in these meanings in the present invention).

Meanwhile, as illustrated in FIG. 5, if the concentration of As is highest in a region within 50 nm from the interface between the anti-crystallization layer and the photo-conductive layer for recording, it is possible to effectively suppress crystallization at the interface between the anti-crystallization layer and the photo-conductive layer for recording. In the photoconductive layer for recording, the concentration of alkali metal is not always evenly distributed. There are cases, such as U.S. Pat. No. 5,396,072, for example, in which the photoconductive layer for recording contains more alkali metal at the interface thereof. At this interface, there is a tendency that a reaction with oxygen, $H_2O$ or the like in a vacuum chamber easily occurs, and that crystallization easily occurs. Therefore, if the concentration of As (specific element) is highest in a region within 50 nm from the interface between the anti-crystallization layer and the photoconductive layer for recording, it is possible to achieve maximum crystallization-suppression effect even if the amount of doped As is small. In this case, the average concentration of As in the region of the anti-crystallization layer within 50 nm from the interface with the upper layer may be less than or equal to 1%.

Figure 6:
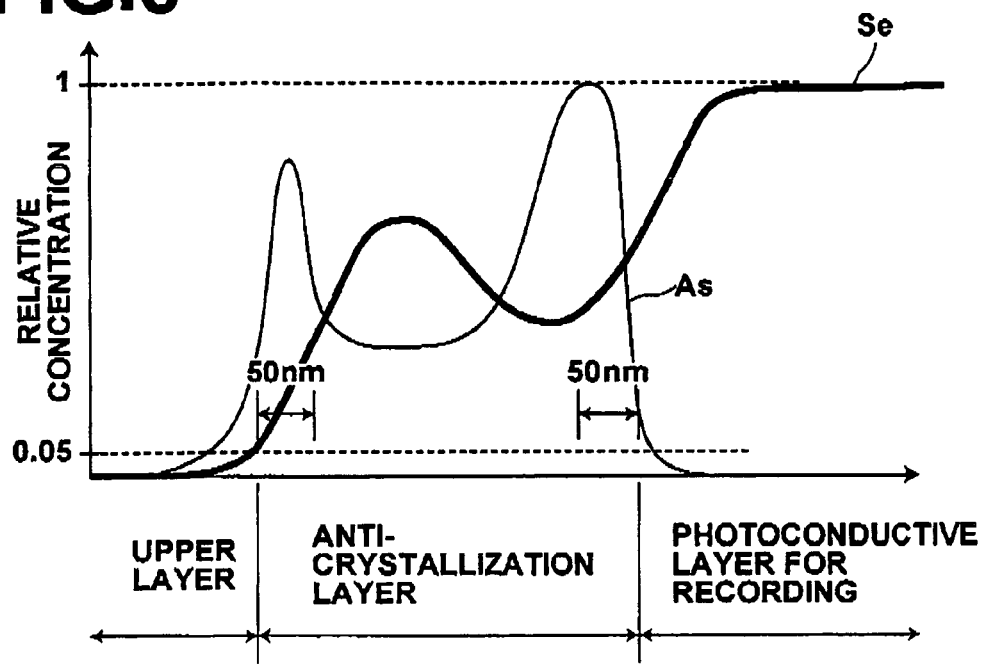
FIG. 6 is a schematic diagram illustrating a third example of the distribution of the concentration of each of As and Se in an anti-crystallization layer.

Further, as illustrated in FIG. 6, if an average concentration of As in the anti-crystallization layer excluding an upper-layer-side region and a photoconductive-layer-for-recording-side region is less than or equal to 80% of the smaller of the highest value of the concentration of As in the upper-layer-side region and that of the concentration of As in the photo-conductive-layer-for-recording-side region, when the upper-layer-side region is a region of the anti-crystallization layer within 50 nm from the interface with the upper layer and the photoconductive-layer-for-recording-side region is a region of the anti-crystallization layer within 50 nm from the interface with the photoconductive layer for recording, it is possible to reduce the average element concentration in the whole anti-crystallization layer. Specifically, the average element concentration in the whole anti-crystallization layer can be reduced by increasing the concentration at the interface on either side of the anti-crystallization layer and by reducing the average concentration in the other region to less than or equal to 80% (optionally, less than or equal to 50%) of the smaller of the highest value of the concentration of As in the upper-layer-side region and that of the concentration of As in the photoconductive-layer-for-recording-side region. Accordingly, it is possible to reduce the average element concentration in the whole anti-crystallization layer to less than or equal to 1%.

Further, anti-crystallization layers may be provided both between the first electrode 1 and the photoconductive layer 3 for recording and between the charge-collecting electrode 4 and the photoconductive layer 3 for recording, as illustrated in FIG. 3. In this case, it is sufficient if at least one of the anti-crystallization layers is an amorphous selenium layer containing specific elements at 5% to 40%. Optionally, both of the anti-crystallization layers may be amorphous selenium layers, each containing specific elements at 5% to 40%.

The photoconductive layer for recording has amorphous selenium as its major component and further contains alkali metal, such as Na, K and Li. Optionally, the content of the alkali metal may be in the range of from 0.01 to 5000 ppm. Normally, when the content of alkali metal is higher than 0.01 ppm, crystallization tends to occur at the interface with the upper layer. Therefore, it is impossible to prevent an increase in image defects and to prevent a decrease in durability. However, in the radiation image detector of the present invention, the anti-crystallization layer is provided, as described above. Therefore, it is possible to improve the image quality by preventing crystallization while sensitivity deterioration is prevented. Farther, the photoconductive layer for recording may contain an appropriate amount of arsenic in addition to alkali metal. If the photoconductive layer for recording contains arsenic, it is possible to reduce crystallization at the bulk of amorphous selenium.

As a material for the first electrode, a conductor, such as Au and Al, that can be vapor-deposited by resistance heating, and that can keep influence of radiant heat at a low level, is appropriate. The charge-collecting electrode is made of ITO (indium tin oxide) or a photoconductive material, such as Au and Pt.

The radiation image detector may be produced by using a well-known method. However, it is desirable that the anti-crystallization layer and the photoconductive layer for recording are continuously vapor-deposited (formed) in the same vacuum. Further, it is possible to further enhance an anti-crystallization effect by depositing layers at high speed using the same vapor-deposition mask.

Figure 7:
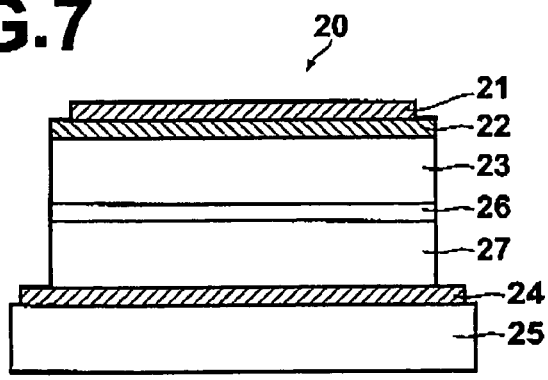
FIG. 7 is a schematic diagram illustrating a cross-sectional view of a first embodiment of a radiation image detector (optical readout method) of the present invention.

Next, a radiation image detector using an optical readout method will be described. FIG. 7 is a schematic diagram illustrating a cross-sectional view of a radiation image detector using the optical readout method in a first embodiment of the present invention. As illustrated in FIG. 7, a radiation image detector 20 includes a first electrode 21, an anti-crystallization layer 22, a photoconductive layer 23 for recording, a charge transport layer 26, a photoconductive layer 27 for readout, a multiplicity of linear electrodes (comb-shaped electrodes) 24 for readout and a substrate 25, which are superposed one on another in this order. The first electrode 21 transmits an electromagnetic wave for recording that carries a radiation image. The photoconductive layer 23 for recording generates charges by irradiation with the electromagnetic wave for recording that has been transmitted through the first electrode 21. Further, the photoconductive layer 23 for recording has amorphous selenium as its major component and further contains alkali metal. The charge transport layer 26 substantially acts as an insulator for charges (latent image polar charges; for example, negative charges) attracted by the first electrode 21. Further, the charge transport layer 26 substantially acts as a conductor for charges (transportation polar charges; positive charges in the above example) of which the polarity is opposite to that of the charges attracted by the first electrode 21. The photoconductive layer 27 for readout generates charges by irradiation with readout light.

Figure 8:
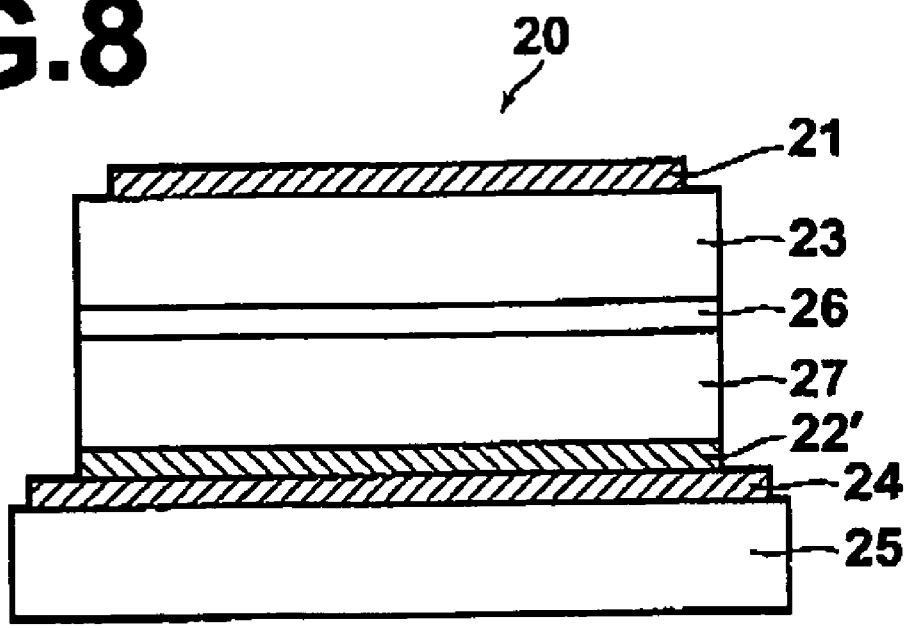
FIG. 8 is a schematic diagram illustrating a cross-sectional view of a second embodiment of a radiation image detector (optical readout method) of the present invention.

FIG. 8 is a schematic diagram illustrating a cross-sectional view of a radiation image detector using an optical readout method in a second embodiment of the present invention. As illustrated in FIG. 8, a radiation image detector 20 includes a first electrode 21, a photoconductive layer 23' for recording, a charge transport layer 26, a photoconductive layer 27' for readout, an anti-crystallization layer 22', a multiplicity of linear electrodes (comb-shaped electrodes) 24 for readout and a substrate 25, which are superposed one on another in this order. The first electrode 21 transmits an electromagnetic wave for recording that carries a radiation image. The photoconductive layer 23' for recording generates charges by irradiation with the electromagnetic wave for recording that has been transmitted through the first electrode 21. The charge transport layer 26 substantially acts as an insulator for charges (latent image polar charges; for example, negative charges) attracted by the first electrode 21. Further, the charge transport layer 26 substantially acts as a conductor for charges (transportation polar charges; positive charges in the above example) of which the polarity is opposite to that of the charges attracted by the first electrode 21. The photoconductive layer 27' for readout generates charges by irradiation with readout light. Further, the photoconductive layer 27' has amorphous selenium as its major component and further contains alkali metal.

The charge transport layer 26 acts as an insulator for charges of which the polarity is the same as that of charges attracted by the first electrode 21 and substantially acts as a conductor for charges of which the polarity is opposite to that of the charges attracted by the first electrode 21. Therefore, negative charges that have moved in the photoconductive layer 23 for recording stop at the interface between the photoconductive layer 23 for recording and the charge transport layer 26 and stored at the interface (charge storage portion). When the charge transport layer 26 is not included in the radiation image detector, the charge storage portion is at the interface between the photoconductive layer 23 for recording and the photoconductive layer 27 for readout (in the second embodiment, the interface between the photoconductive layer 23' for recording and the photoconductive layer 27' for readout).

Figure 9:
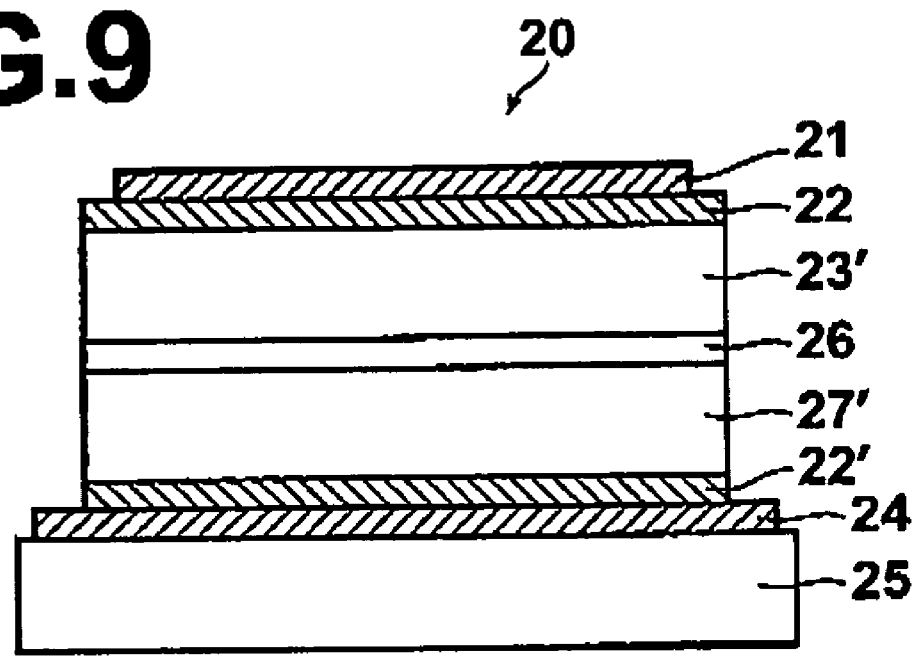
FIG. 9 is a schematic diagram illustrating a cross-sectional view of a third embodiment of a radiation image detector (optical readout method) of the present invention.

The anti-crystallization layers 22 and 22' maybe a-Se layers, each containing at least one element selected from the group consisting of As, Sb and Bi at 5% to 40%. Optionally, the at least one element contained in each of the a-Se layers may be in the range of from 7% to 40%, and further optionally, in the range of from 10% to 40%. The meaning of numerical value limitation of the specific elements is similar to the meaning described in the explanation of the anti-crystallization layers 2 and 2'. Therefore, description of the meaning will be omitted. The anti-crystallization layers may be provided both at the interface between the first electrode 22 and the photoconductive layer 23 for recording and at the interface between the linear electrodes 24 and the photoconductive layer 27' for readout, as illustrated in FIG. 9. In this case, it is sufficient if at least one of the anti-crystallization layers is an amorphous selenium layer containing specific elements at 5% to 40%. Optionally, both of the anti-crystallization layers may be amorphous selenium layers, each containing specific elements at 5% to 40%

Optionally, the photoconductive layer 23 for recording in the radiation image detector using an optical readout method in the first embodiment of the present invention and the photoconductive layer 27' for readout in the radiation image detector using an optical readout method in the second embodiment of the present invention may be layers that have amorphous selenium as major components and further contain alkali metal, such as Na, K and Li. Further optionally, the content of alkali metal may be in the range of from 0.01 to 5000 ppm. Normally, when the content of alkali metal is higher than 0.01 ppm, crystallization tends to occur at the interface with the upper layer in the first embodiment and at the interface with the lower layer in the second embodiment. Therefore, it is impossible to prevent both increase in image defects and decrease in durability. However, in the radiation image detector of the present invention, the anti-crystallization layer is provided, as described above. Therefore, it is possible to improve the image quality by preventing both sensitivity deterioration and crystallization at the same time.

The photoconductive layer 23' for recording in the radiation image detector using an optical readout method in the second embodiment of the present invention should be a layer that generates charges by irradiation with a radiation. As the material for the photoconductive layer 23', PbO, PbI$_2$ or the like, which has relatively high quantum efficiency for radiation, is appropriate. PbO, PbI$_2$ and the like are also advantageous in that they have high dark resistance.

As the material for the photoconductive layer 27 for readout in the radiation image detector using the optical readout method in the first embodiment of the present invention, a photoconductive material that contains at least one of a-Se, Se—Te, Se—As—Te, non-metal phthalocyanine, metal phthalocyanine, MgPc (Magnesium phthalocyanine), VoPc (phase II of Vanadyl phthalocyanine), CuPc (Copper phthalocyanine) and the like as its major component is appropriate.

As the material for the first electrode 21, a photoconductive material, such as Au and Al, that can be vapor-deposited by resistance heating, and that can keep influence of radiant heat at a low level, is appropriate. For example, as the linear electrode 24, an electrode formed by depositing a layer of a transparent photoconductive material (ITO, IZO or the like) on a transparent glass plate and further by patterning is appropriate because it has a smooth edge shape. As the material for the charge transport layer 26, a semiconductor material that contains Se, such as As$_2$Se$_3$ that is doped with 10 to 3000 ppm of I and a-Se that is doped with 10 to 200 ppm of Cl, is appropriate.

The radiation image detector using the optical readout method, as described above, may be produced by using a well-known method. However, it is desirable that the anti-crystallization layer and the photoconductive layer for recording are continuously formed by vapor-deposition in the same vacuum. Further, if the anti-crystallization layer and the photoconductive layer for recording are deposited at high speed using the same vapor-deposition mask, it is possible to further enhance the anti-crystallization effect.

Examples of the radiation image detector of the present invention will be described.

EXAMPLES

Comparative Example 1

A Pyrex (registered trademark) glass tube was filled with high purity (5N) selenium to which $Na_2Se$ for Na-doping had been added. Then, the selenium to which $Na_2Se$ had been added was vacuum-enclosed at 0.1 Pa or less and reacted at 550° C. to produce Na selenium alloy at a molarity of 30 ppm. Then, a stainless steel crucible was filled with the selenium alloy. Under conditions with a crucible temperature of 280° C. and a vacuum level of 0.0001 Pa, vapor-deposition was performed on a glass substrate of 5 cm×5 cm on which a comb-shaped amorphous IZO (indium zinc oxide) layer had been formed. Under conditions with a substrate temperature of 65 degrees and vapor-deposition speed of 1 μm/min, a Na-containing-Se-coating with a thickness of 10 μm was formed on the glass substrate. Next, the crucible temperature was changed to 460° C. and a layer of $As_2Se_3$ (6N, manufactured by Furuuchi Chemical Corporation) with a thickness of 0.2 μm was deposited. Further, a Na-containing-Se-coating with a thickness of 200 μm was deposited in a similar manner. Then, a coating of $Sb_2S_3$ (6N, manufactured by Furuuchi Chemical Corporation) with a thickness of 0.1 μm was deposited at a crucible temperature of 550° C. Finally, Au was vapor-deposited to form an upper electrode with a thickness of 60 nm. Accordingly, a device was produced.

Examples 1 Through 7 and Comparative Examples 2 Through 6

Devices were produced in a manner similar to the method for producing the device of comparative example 1 except that an anti-crystallization layer 22' shown in Table 1 was inserted on the comb-shaped amorphous IZO layer of comparative example 1 and that an anti-crystallization layer 22 shown in Table 1 was inserted under the $Sb_2S_3$ layer of comparative example 1.

Each of the anti-crystallization layers was produced by evaporating Se alloy raw material that contains As, of which the composition is shown in Table 1, at a crucible temperature of 440° C. so that the thickness of the layer becomes 0.15 μm. In this case, the amount of SeAs raw material that was added to the crucible was approximately ten times as large as an amount required to form a layer with a thickness of 0.15 μm. Further, the distribution of As concentration was controlled by controlling open/close timing or open/close time of a shutter provided over the crucible. Specifically, the anti-crystallization layer 22 was produced by opening a substrate shutter in the second half of vapor deposition so that the highest concentration is achieved at the $Sb_2S_3$-side interface and by increasing the temperature of the crucible to 460° C. after the substrate shutter was opened. The anti-crystallization layer 22' was produced by opening the substrate shutter at the middle of vapor deposition so that the highest concentration is achieved at the IZO-side interface and by lowering the temperature of the crucible to 380° C. after the substrate shutter was opened.

Table 1 shows results and properties of comparative examples 1 through 3 and examples 1 through 10. Charge-collecting amounts, image defects and offset charge amounts in Table 1 were evaluated as described below. In Table 1, the charge-collecting amounts, ratios of the numbers of image defects and offset charge amounts are represented by values relative to those of comparative example 1.

(Charge-Collecting Amount and Image Defect)

The charge-collecting amounts were measured using an image readout apparatus disclosed in Japanese Unexamined Patent Publication No. 2004-147255. The image defects were measured using the same image readout apparatus. The image defects were measured by outputting signals as a two-dimensional image without irradiation with a radiation or light and by counting spots (white spots are formed by crystallization on the substrate side and black spots are formed by crystallization on the upper electrode side) larger than or equal to 50 μm. Then, the devices were kept in a dry condition at 40° C. for two weeks. After two weeks, spots were counted again in a similar manner. Then, ratios of the numbers of image defects before being kept in the dry condition to those of image defects after being kept in the dry condition were calculated.

(Offset Charge Amount)

Offset charges were measured using the same readout apparatus. The offset charges were measured by reading out after applying voltage of −2 kV to the upper electrode for time 2 s without irradiation with a radiation or light. In this case, if dark current injected from the upper electrode is higher than dark current injected from the lower electrode, the polarity of the offset charge amount, which is read out as described above, is positive (plus). In contrast, if dark current injected from the upper electrode is lower than dark current injected from the lower electrode, the polarity of the offset charge amount is negative (minus). Further, a large offset charge amount indicates that a large amount of dark current has been injected.

TABLE 1

|  | Anti-Crystallization Layer 22' | | Anti-Crystallization Layer 22 | | | Ratio of Numbers of Image Defects | | |
| --- | --- | --- | --- | --- | --- | --- | --- | --- |
|  | As Raw M. (%) | XPS A. (%) | As Raw M. (%) | XPS A. (%) | Charge Collecting Amount | White Spot | Black Spot | Offset Amount |
| C. Ex. 1 | — | — | — | — | 1.0 | 1 | 1 | 1 |
| C. Ex. 2 | 0.1 | 0.05 | 0.1 | 0.5 | 1.0 | 0.98 | 0.98 | 1 |
| C. Ex. 3 | 44 | 44 | 44 | 44 | 0.8 | 5 | 5 | −100 |
| C. Ex. 4 | 0.4 | 0.3 | 0.4 | 2.1 | 1.0 | 0.9 | 0.6 | 1 |
| C. Ex. 5 | 1 | 0.7 | 1 | 3.0 | 1.0 | 0.7 | 0.4 | 1 |
| C. Ex. 6 | 2 | 1.5 | 2 | 3.8 | 1.0 | 0.5 | 0.3 | 1 |
| Ex. 1 | 3 | 4.0 | 3 | 5.5 | 1.0 | 0.1 | 0.1 | 1 |
| Ex. 2 | 5 | 9.1 | 5 | 11 | 1.0 | 0.001 | 0.001 | 1 |
| Ex. 3 | 10 | 13 | 10 | 15 | 1.0 | 0.001 | 0.001 | −1.2 |
| Ex. 4 | 15 | 17 | 15 | 20 | 1.0 | 0.001 | 0.001 | −1.5 |
| Ex. 5 | 20 | 20 | 20 | 22 | 1.0 | 0.001 | 0.001 | −2 |

TABLE 1-continued

| | Anti-Crystallization Layer 22' | | Anti-Crystallization Layer 22 | | | Ratio of Numbers of Image Defects | | |
|---|---|---|---|---|---|---|---|---|
| | As Raw | XPS | As Raw | XPS | Charge Collecting Amount | White Spot | Black Spot | Offset Amount |
| | M. (%) | A. (%) | M. (%) | A. (%) | | | | |
| Ex. 6 | 33 | 33 | 33 | 38 | 1.0 | 0.001 | 0.001 | −5 |
| Ex. 7 | 40 | 39 | 40 | 41 | 1.0 | 0.7 | 0.7 | −10 |

(In Table 1, "C. Ex." refers to comparative example, and "Ex." refers to example. Further, "As raw M." refers to As raw material, and "XPS A." refers to XPS analysis.)

In comparative example 2 and example 1, Se layers were peeled off from the glass substrates and XPS analyses were performed from the interfaces on both sides to measure the concentrations of As in the anti-crystallization layer 22' and the anti-crystallization layer 22. According to the analyses, the average concentration of As within 50 nm from the IZO interface of the anti-crystallization layer 22' in the device of comparative example 2 was 0.05%. Further, the average concentration of As within 50 nm from the $Sb_2S_3$ interface of the anti-crystallization layer 22 in the device of comparative example 2 was 0.5%. Meanwhile, the average concentration of As within 50 nm from the IZO interface of the anti-crystallization layer 22' in the device of example 1 was 4.0%. Further, the average concentration of As within 50 nm from the $Sb_2S_3$ interface of the anti-crystallization layer 22 in the device of example 1 was 5.5%. Measurement by XPS analysis was performed, as follows.

(XPS Analysis)

| | |
|---|---|
| Machine used in measurement: | VG Theta Probe, manufactured by Thermo Electron Corporation |
| Radiated X-rays: | Single crystal spectroscopy AlKα |
| Ion species: | Ar⁺ |
| Etching Rate: | 0.4 Å/sec ($SiO_2$ conversion value) |

Sensitivity correction method: A sample that contains Se and As is prepared to correct sensitivity. First, the concentration of As and Se is determined by ICP-MS (inductively-coupled plasma mass-spectrometry) analysis. Next, the same sample is analyzed by XPS, and a sensitivity correction coefficient is obtained so that the concentration of As and Se obtained by XPS analysis becomes the same as the value obtained by ICP-MS analysis. Then, the distribution of the concentration of As in a predetermined sample is determined based on the sensitivity correction coefficient.

The thickness of the anti-crystallization layer in each of examples 1 through 7 and comparative examples 2 through 6 was obtained based on the profile of the concentration of As and Se obtained by XPS analysis. The thickness of each of all the anti-crystallization layers was 0.15 μm.

As Table 1 clearly shows, the numbers of image defects were reduced in examples 1 through 7, in each of which the anti-crystallization layer contains As at 5% to 40%. Particularly, the numbers of image defects were notably reduced in examples 2 through 6, in each of which both of the anti-crystallization layers, contain As at 5% to 40%. Further, in examples 5 through 7, the offset amounts are increased −2 times through −10 times from the offset amounts in the comparative example. This indicates that the amount of charges injected from the IZO electrode, which is a positive electrode, to the device has increased.

As described above, in the radiation image detector of the present invention, an a-Se layer is provided as an anti-crystallization layer at the interface of the photoconductive layer for recording or at the interface of the photoconductive layer for readout. The photoconductive layer for recording and the photoconductive layer for readout are layers having amorphous selenium as their major components and further containing alkali metal. The a-Se layer is an a-Se layer that contains at least one element selected from the group consisting of As, Sb and Bi at 5% to 40%. Therefore, it is possible to prevent sensitivity deterioration and an increase in the number of image defects due to time passage.

What is claimed is:

1. A radiation image detector comprising:
a first electrode for transmitting an electromagnetic wave for recording, the electromagnetic wave carrying a radiation image;
a photoconductive layer for recording;
a plurality of charge-collecting electrodes; and
a substrate, wherein the photoconductive layer for recording generates charges by irradiation with the electromagnetic wave for recording that has been transmitted through the first electrode, and wherein the photoconductive layer for recording has amorphous selenium as its major component and further contains alkali metal, and wherein the first electrode, the photoconductive layer for recording, the plurality of charge-collecting electrodes and the substrate are superposed one on another in this order, and wherein an amorphous selenium layer is further provided as an anti-crystallization layer between the first electrode and the photoconductive layer for recording, and wherein the amorphous selenium layer contains at least one element selected from the group consisting of As, Sb and Bi, and wherein the anti-crystallization layer includes at least a region in which the value of the concentration of the at least one element is highest and a region in which the value of the concentration of the at least one element is less than or equal to 80% of the highest value of the concentration of the at least one element.

2. A radiation image detector, as defined in claim 1, wherein the concentration of the at least one element in the region in which the value of the concentration of the at least one element is highest is in the range of from 5% to 40%.

3. A radiation image detector, as defined in claim 1, wherein the value of the concentration of the at least one element in the anti-crystallization layer is highest in a region within 50 nm from the interface with an upper layer positioned on a side of the anti-crystallization layer, the side being apposite to the photoconductive layer for recording, wherein the upper layer does not contain amorphous selenium as its major component.

4. A radiation image detector, as defined in claim 1, wherein the value of the concentration of the at least one element in the anti-crystallization layer is highest in a region within 50 nm from the interface with the photoconductive layer for recording.

5. A radiation image detector, as defined in claim 1, wherein an average concentration of the at least one element in the anti-crystallization layer excluding an upper-layer-side region and a photoconductive-layer-for-recording-side region is less than or equal to 80% of the smaller of the highest value of the concentration of the at least one element in the upper-layer-side region and that of the concentration of the at least one element in the photoconductive-layer-for-recording-side region, and wherein the upper-layer-side region is a region of the anti-crystallization layer within 50 nm from the interface with an upper layer positioned on a side of the anti-crystallization layer, the side being opposite to the photoconductive layer for recording, and wherein the upper layer does not contain amorphous selenium as its major component, and wherein the photoconductive-layer-for-recording-side region is a region of the anti-crystallization layer within 50 nm from the interface with the photoconductive layer for recording.

6. A radiation image detector, as defined in claim 1, wherein the content of the alkali metal is in the range of from 0.01 ppm to 5000 ppm.

7. A radiation image detector comprising:
a first electrode for transmitting an electromagnetic wave for recording, the electromagnetic wave carrying a radiation image;
a photoconductive layer for recording;
a plurality of charge-collecting electrodes; and
a substrate, wherein the photoconductive layer for recording
generates charges by irradiation with the electromagnetic wave for recording that has been transmitted through the first electrode, and wherein the photoconductive layer for recording has amorphous selenium as its major component and further contains alkali metal, and wherein the first electrode, the photoconductive layer for recording, the plurality of charge-collecting electrodes and the substrate are superposed one on another in this order, and wherein an amorphous selenium layer is further provided as an anti-crystallization layer between the charge-collecting electrodes and the photoconductive layer for recording, and wherein the amorphous selenium layer contains at least one element selected from the group consisting of As, Sb and Bi, and wherein the anti-crystallization layer includes at least a region in which the value of the concentration of the at least one element is highest and a region in which the value of the concentration of the at least one element is less than or equal to 80% of the highest value of the concentration of the at least one element.

8. A radiation image detector, as defined in claim 7, wherein the concentration of the at least one element in the region in which the value of the concentration of the at least one element is highest is in the range of from 5% to 40%.

9. A radiation image detector, as defined in claim 7, wherein the value of the concentration of the at least one element in the anti-crystallization layer is highest in a region within 50 nm from the interface with a lower layer positioned on a side of the anti-crystallization layer, the side being opposite to the photoconductive layer for recording, wherein the lower layer does not contain amorphous selenium as its major component.

10. A radiation image detector, as defined in claim 7, wherein the value of the concentration of the at least one element in the anti-crystallization layer is highest in a region within 50 nm from the interface with the photoconductive layer for recording.

11. A radiation image detector, as defined in claim 7, wherein an average concentration of the at least one element in the anti-crystallization layer excluding a lower-layer-side region and a photoconductive-layer-for-recording-side region is less than or equal to 80% of the smaller of the highest value of the concentration of the at least one element in the lower-layer-side region and that of the concentration of the at least one element in the photoconductive-layer-for-recording-side region, and wherein the lower-layer-side region is a region of the anti-crystallization layer within 50 nm from the interface with a lower layer positioned on a side of the anti-crystallization layer, the side being opposite to the photoconductive layer for recording, and wherein the lower layer does not contain amorphous selenium as its major component, and wherein the photoconductive-layer-for-recording-side region is a region of the anti-crystallization layer within 50 nm from the interface with the photoconductive layer for recording.

12. A radiation image detector, as defined in claim 9, wherein the lower layer is a semi-insulator layer.

13. A radiation image detector, as defined in claim 11, wherein the lower layer is a semi-insulator layer.

14. A radiation image detector comprising:
a first electrode for transmitting an electromagnetic wave for recording, the electromagnetic wave carrying a radiation image;
a photoconductive layer for recording;
a charge storage portion for storing charges generated in the photoconductive layer for recording;
a photoconductive layer for readout;
a multiplicity of linear electrodes for readout; and
a substrate, wherein the photoconductive layer for recording generates charges by irradiation with the electromagnetic wave for recording that has been transmitted through the first electrode, and wherein the photoconductive layer for recording has amorphous selenium as its major component and further contains alkali metal, and wherein the photoconductive layer for readout generates charges by irradiation with readout light, and wherein the first electrode, the photoconductive layer for recording, the charge storage portion, the photoconductive layer for readout, the multiplicity of linear electrodes for readout and the substrate are superposed one on another in this order, and wherein an amorphous selenium layer is further provided as an anti-crystallization layer between the first electrode and the photoconductive layer for recording, and wherein the amorphous selenium layer contains at least one element selected from the group consisting of As, Sb and Bi, and wherein the anti-crystallization layer includes at least a region in which the value of the concentration of the at least one element is highest and a region in which the value of the concentration of the at least one element is less than or equal to 80% of the highest value of the concentration of the at least one element.

15. A radiation image detector, as defined in claim 14, wherein the concentration of the at least one element in the region in which the value of the concentration of the at least one element is highest is in the range of from 5% to 40%.

16. A radiation image detector, as defined in claim 14, wherein the value of the concentration of the at least one element in the anti-crystallization layer is highest in a region within 50 nm from the interface with an upper layer positioned on a side of the anti-crystallization layer, the side being opposite to the photoconductive layer for recording, wherein the upper layer does not contain amorphous selenium as its major component.

17. A radiation image detector, as defined in claim 14, wherein the value of the concentration of the at least one element in the anti-crystallization layer is highest in a region within 50 nm from the interface with the photoconductive layer for recording.

18. A radiation image detector, as defined in claim 14, wherein an average concentration of the at least one element in the anti-crystallization layer excluding an upper-layer-side region and a photoconductive-layer-for-recording-side region is less than or equal to 80% of the smaller of the highest value of the concentration of the at least one element in the upper-layer-side region and that of the concentration of the at least one element in the photoconductive-layer-for-recording-side region, wherein the upper-layer-side region is a region of the anti-crystallization layer within 50 nm from the interface with an upper layer positioned on a side of the anti-crystallization layer, the side being opposite to the photoconductive layer for recording, and wherein the upper layer does not contain amorphous selenium as its major component, and wherein the photoconductive-layer-for-recording-side region is a region of the anti-crystallization layer within 50 nm from the interface with the photoconductive layer for recording.

19. A radiation image detector comprising:
a first electrode for transmitting an electromagnetic wave for recording, the electromagnetic wave carrying a radiation image; a photoconductive layer for recording;
a charge storage portion for storing charges generated in the photoconductive layer for recording;
a photoconductive layer for readout;
a multiplicity of linear electrodes for readout; and
a substrate, wherein the photoconductive layer for recording generates charges by irradiation with the electromagnetic wave for recording that has been transmitted through the first electrode, and wherein the photoconductive layer for readout generates charges by irradiation with readout light, and wherein the photoconductive layer for readout has amorphous selenium as its major component and further contains alkali metal, and wherein the first electrode, the photoconductive layer for recording, the charge storage portion, the photoconductive layer for readout, the multiplicity of linear electrodes for readout and the substrate are superposed one on another in this order, and wherein an amorphous selenium layer is further provided as an anti-crystallization layer between the linear electrodes and the photoconductive layer for readout, and wherein the amorphous selenium layer contains at least one element selected from the group consisting of As, Sb and Bi, and wherein the anti-crystallization layer includes at least a region in which the value of the concentration of the at least one element is highest and a region in which the value of the concentration of the at least one element is less than or equal to 80% of the highest value of the concentration of the at least one element.

20. A radiation image detector, as defined in claim 19, wherein the concentration of the at least one element in the region in which the value of the concentration of the at least one element is highest is in the range of from 5% to 40%.

21. A radiation image detector, as defined in claim 19, wherein the value of the concentration of the at least one element in the anti-crystallization layer is highest in a region within 50 nm from the interface with a lower layer positioned on a side of the anti-crystallization layer, the side being opposite to the photoconductive layer for readout, wherein the lower layer does not contain amorphous selenium as its major component.

22. A radiation image detector, as defined in claim 19, wherein the value of the concentration of the at least one element in the anti-crystallization layer is highest in a region within 50 nm from the interface with the photoconductive layer for readout.

23. A radiation image detector, as defined in claim 19, wherein an average concentration of the at least one element in the anti-crystallization layer excluding a lower-layer-side region and a photoconductive-layer-for-readout-side region is less than or equal to 80% of the smaller of the highest value of the concentration of the at least one element in the lower-layer-side region and that of the concentration of the at least one element in the photoconductive-layer-for-readout-side region, and wherein the lower-layer-side region is a region of the anti-crystallization layer within 50 nm from the interface with a lower layer positioned on a side of the anti-crystallization layer, the side being opposite to the photoconductive layer for readout, and wherein the lower layer does not contain amorphous selenium as its major component, and wherein the photoconductive-layer-for-readout-side region is a region of the anti-crystallization layer within 50 nm from the interface with the photoconductive layer for readout.

24. A radiation image detector, as defined in claim 21, wherein the lower layer is a semi-insulator layer.

25. A radiation image detector, as defined in claim 23, wherein the lower layer is a semi-insulator layer.

* * * * *